US007114111B2

(12) United States Patent
Noy

(10) Patent No.: US 7,114,111 B2
(45) Date of Patent: Sep. 26, 2006

(54) METHOD AND APPARATUS FOR MAXIMIZING TEST COVERAGE

(75) Inventor: Amos Noy, Jerusalem (IL)

(73) Assignee: Cadence Design (Isreal) II Ltd., Rosh Ha'Ayin (IL)

( * ) Notice: Subject to any disclaimer, the term of this patent is extended or adjusted under 35 U.S.C. 154(b) by 600 days.

(21) Appl. No.: 09/799,065

(22) Filed: Mar. 6, 2001

(65) Prior Publication Data

US 2001/0010091 A1 Jul. 26, 2001

Related U.S. Application Data

(63) Continuation-in-part of application No. 09/327,966, filed on Jun. 8, 1999, now Pat. No. 6,675,138.

(60) Provisional application No. 60/208,822, filed on Jun. 2, 2000.

(51) Int. Cl.
*G01R 31/28* (2006.01)
*G06F 17/50* (2006.01)

(52) U.S. Cl. .......................... 714/738; 716/4

(58) Field of Classification Search ................ 714/738, 714/739, 726, 741; 716/4, 5
See application file for complete search history.

(56) References Cited

U.S. PATENT DOCUMENTS

| | | | |
|---|---|---|---|
| 4,937,765 A | 6/1990 | Shupe et al. | |
| 5,202,889 A | 4/1993 | Aharon et al. | |
| 5,450,414 A * | 9/1995 | Lin | 714/726 |
| 5,633,812 A | 5/1997 | Allen et al. | |
| 5,844,909 A | 12/1998 | Wakui | |
| 6,044,214 A | 3/2000 | Kimura et al. | |
| 6,052,809 A * | 4/2000 | Bowden | 714/738 |
| 6,059,451 A | 5/2000 | Scott et al. | |
| 6,647,513 B1 * | 11/2003 | Hekmatpour | 714/37 |

OTHER PUBLICATIONS

Sneed, H.M., "State Coverage of Embedded Realtime Programs", *Proc. 2nd Workshop on Software Testing, Verification & Analysis*, p. 245, 1998.
Greggain et al. "Fault Grading, a Measure of Logic Simulation Integrity", *Proc. 2nd Annual IEEE ASIC Seminar and Exhibit*, pp. 9-2.1-9-2.4.
Piwowarski et al, "Coverage Measurement Experience During Function Test", *IEEE Proc. 15th Int. Conf. Software Engineering*, pp. 287-301, 1993.
Moundanos et al, "Abstraction Techniques for Validation Coverage Analysis and Test Generation", *IEEE Transaction on Computers*, vol. 47 pp. 2-14. 1998.

(Continued)

Primary Examiner—James C. Kerveros
(74) Attorney, Agent, or Firm—Rosenberg, Klein & Lee

(57) ABSTRACT

A method and an apparatus for determining functional coverage of a design for a device under test (DUT), the design being encapsulated in a DUT circuit design specification, in a test environment during a design test verification process.

The method and apparatus utilize a coverage metric constructed from a plurality of coverage items. A first step involves obtaining a coverage group from the DUT design, for examining during the design test verification process. The coverage group includes at least one functional coverage item. Then, a set of input values is provided to the design test verification process. Next, design test verification process is performed with the set of input test values to obtain a value for each coverage item.

Next step involves examining obtained coverage by comparing the value obtained from each coverage item with a coverage goal. Finally, the set of input test value is automatically altered in accordance with the examination of the obtained coverage.

28 Claims, 6 Drawing Sheets

OTHER PUBLICATIONS

Debany et al, "Design Verification Using Logic Tests", *2nd Int. Workshop on Rapid System Prototyping. Shortening the Path from Spec. to Prototype,* pp. 17-24, 1991.

Benjamin et al, "A Study in Coverage-Driven Test Generation", *DAC,* pp. 970-975, 1999.

* cited by examiner coverage feedback coverage feedback

METHOD AND APPARATUS FOR MAXIMIZING TEST COVERAGE

CROSS REFERENCE TO RELATED APPLICATIONS

This application is a continuation in part of, commonly assigned U.S. patent application Ser. No. 09/327,966, entitled "System and Method for Measuring Temporal Coverage Detection", filed Jun. 8, 1999, now U.S. Pat. No. 6,675,138, and incorporated herein in full by reference. This application also is a continuation in part of U.S. Application Ser. No. 60/208,822, entitled "Method and Apparatus for Maximizing Test Coverage", filed Jun. 2, 2000 and incorporated herein in full by reference.

FIELD OF THE INVENTION

This invention relates to computer software, more particularly to computer software for analyzing the functionality of a circuit design and for analyzing the functional correctness of the circuit design.

BACKGROUND OF THE INVENTION

The field of electronic design automation (EDA) is well established. A number of software tools are used to describe a circuit at various levels of granularity or specificity. Such tools include gate level descriptions, which specify the circuit in very great detail, to high level descriptions written in hardware description languages such as Verilog or VHDL. The process of verifying a design through a simulation model of the device is aided by the availability of Verilog and VHDL. These languages are designed to describe hardware both at higher levels of abstraction and as gates or transistors, thus enabling designers to describe the elements and connections between elements of a circuit. Modem circuits have many millions of transistors, so it is essential to use some sort of design tools just to manage the complexity of the design, particularly for design verification.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

As previously described, the process of verifying a design through a simulation model of the device is aided by the availability of hardware description languages such as Verilog and VHDL. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment, particularly for functional verification in order for the various elements be defined and connected together correctly in order to have the circuit perform as specified. Specman Elite™, software developed by Verisity Ltd. in Israel and available through Verisity Design, Inc. in Mountain View, Calif., is the market leader in providing functional verification. Certain attributes of the software are described in copending, commonly assigned U.S. patent application Ser. No. 09/327,966, entitled "System and Method for Measuring Temporal Coverage Detection", filed Jun. 8, 1999, and incorporated herein in full by reference. Useful background information is presented in copending, commonly assigned U.S. patent application Ser. No. 09/020,792, filed Feb. 6, 1998, entitled "Method and Apparatus for Test Generation During Circuit Design."

The test generator disclosed in U.S. patent application Ser. No. 09/020,792 interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

However, the reliance on human intervention is still highly problematic, particularly for increasing the coverage of the tests. "Coverage" is a function of the ability to fully explore the reachable state space of the design, in order to examine all possible functions and outcomes of any particular input or set of inputs to the DUT. Although the coverage of these tests can be increased manually, this is clearly a disadvantage, as it requires extensive input by the engineer. Therefore, a number of methods for attempting to automatically increase coverage are known in the art.

There are generally two classes of "coverage boosters" known in the background art: structural analysis or "white box" systems and knowledge base systems. Structural analysis based coverage enhancement derives coverage from the structure of the DUT, most typically from a gate level implementation of the DUT. A goal such as "toggle each node" is picked as the coverage goal and the test generator is most often based on various search algorithms operating on a representation of the DUT structure. These techniques were first introduced to identify "stuck at" faults in manufactured circuits. An example would be a production test generator such as HITEC from the University of Chicago (Chicago, USA; as described in T. Niermann and J. H. Patel, "HITEC: A Test Generation Package for Sequential Circuits," European Design Automation Conf., Amsterdam, Netherlands, pp. 214–218, February 1991).

More recently there have been some such systems which operate on a higher level (for example Register Transfer Level). In essence such systems are based on the same techniques and most often synthesize the DUT into gates so that structural reasoning can be applied.

The shortcomings of all such methods are as follows. First, there is a lack of reference, since the coverage goals are taken from the DUT alone, without taking into account the specification requirements or the constraints imposed by the environment in which the DUT should function. This kind of testing fails to answer the most crucial question, which is whether the DUT actually functions as specified.

Second, with regard to capacity limitation, since the test generation algorithm requires an analysis of the DUT, the size of the DUT (or more accurately the state space projected by the state variables used to implement the DUT) must be limited. Current techniques are typically limited to small subsections of industrial designs.

Knowledge base systems are the second type of attempt to automatically increase coverage. In these cases the system has some knowledge of the specification of the DUT or the class of devices the DUT belongs to (CPUs for instance). Coverage goals are set according to the expected architectural and micro-architectural features. The knowledge base stores abstract tests aimed at various features. Such tests are applied to boost coverage where needed. The most prominent example of such system is Gensys from IBM (International Business Machines, USA), as disclosed in U.S. Pat. No. 5,202,889.

The major drawback of such a system is the need to construct such a knowledge base. The cost of constructing the knowledge base exceeds the manual work needed to test a specific DUT, so such an approach is viable only in cases where the knowledge base can be amortized over many generations of devices that are similar in function.

SUMMARY OF THE INVENTION

The background art does not teach or suggest a method for maximizing coverage of tests for the DUT by targeting automatically discovered functional coverage goals. In addition, the background art does not teach or suggest a method for increasing such functional coverage which is both unaffected by the size of the DUT state space and is applicable to any class of DUT. Furthermore, the background art does not teach or suggest a method for performing the types of "brute force" tests with crosses between many boundary conditions which users could perform manually, but which they do not have the time or patience to perform. Also, the background art does not teach or suggest a method for iteratively and automatically adjusting the performance of any such method for performing functional tests for obtaining increasingly better functional coverage automatically.

The present invention improves test coverage by identifying coverage holes, modifying the input process to test those areas, then repeating the process iteratively to continue to improve test coverage.

The method of the present invention preferably starts with a user-generated test, from which the coverage information is more preferably extracted, for example from the environment architectural files, and/or from other existing sources of coverage and testing information. Such information optionally and preferably includes coverage groups, items and buckets. Next, the test is run and the results are analyzed. Coverage holes are then automatically targeted by augmenting the test description in order to cover thethese coverage holes. The method of the present invention optionally and most preferably does not alter the user's original test, but instead adds constraints to a separate version of the test, such that the original constraints of the user are stored separately. Also, the method of the present invention has the advantage of being able to determine that certain sets of constraints will prevent certain values or ranges of values from ever being reached by the test, and can act accordingly.

The order and manner in which constraints are added are preferably governed by random policies. The coverage holes are preferably filled according to the grading scheme for the coverage which was described in the previous application. As the grade increases, the probability that the coverage is adequate increases, so the probability that additional coverage is required decreases. Therefore, these holes are preferably filled from lower to higher grades.

Optionally, the method of the present invention can "learn" to increase coverage by correlating the structure/features of any given test to the increase in coverage which was obtained by the test. Such correlation can be uncovered using analysis methods, as well as through adaptive methods such as genetic algorithms or neural networks.

According to the present invention there is provided a method for determining functional coverage of a device under test (DUT) in a test environment during a test verification process, the coverage metric being constructed from a plurality of coverage items, the method comprising: obtaining a coverage group for examining during the test verification process, the coverage group including at least one functional coverage item; providing a set of input values to the test verification process; performing the test verification process with the set of input test values to obtain a value for each coverage item; examining coverage obtained with the coverage group according to the value obtained from each coverage item; and automatically altering the set of input test values.

According to another embodiment of the present invention, there is provided a method for determining functional coverage of a device under test (DUT) in a test environment during a test verification process, the functional coverage being determined according to a coverage metric, the coverage metric being constructed from a plurality of coverage items, each coverage item having a variable for being sampled, the method comprising: providing a set of input values to the test verification process to form a generated test; performing the test verification process with the set of input test values of the generated test to obtain a value for the variable of each coverage item according to the sampling condition; examining coverage obtained with the coverage metric according to the value obtained from each coverage item; and automatically altering the set of input test values to form a new generated test.

According to yet another embodiment of the present invention, there is provided a system for determining functional coverage of a device under test (DUT) in a test environment during a test verification process, the coverage metric being constructed from a plurality of coverage items, each coverage item having a variable, a value of the variable being determined for each test of the test verification process, the system comprising: (a) a test generator for receiving at least one constraint for constraining the value of at least one variable and for generating the test according to the DUT; (b) a run-time system for running the test and for collecting data at run time; and (c) a maximizer for receiving information about the DUT, for receiving the test from the test generator and for receiving the data collected at run time, the maximizer generating an additional test according to the test, the DUT and the data collected at run time.

BRIEF DESCRIPTION OF THE DRAWINGS

The attached figures illustrate certain aspects of the invention but are not meant to be limiting in any way.

DETAILED DESCRIPTION OF THE PREFERRED EMBODIMENTS

Figure 1:
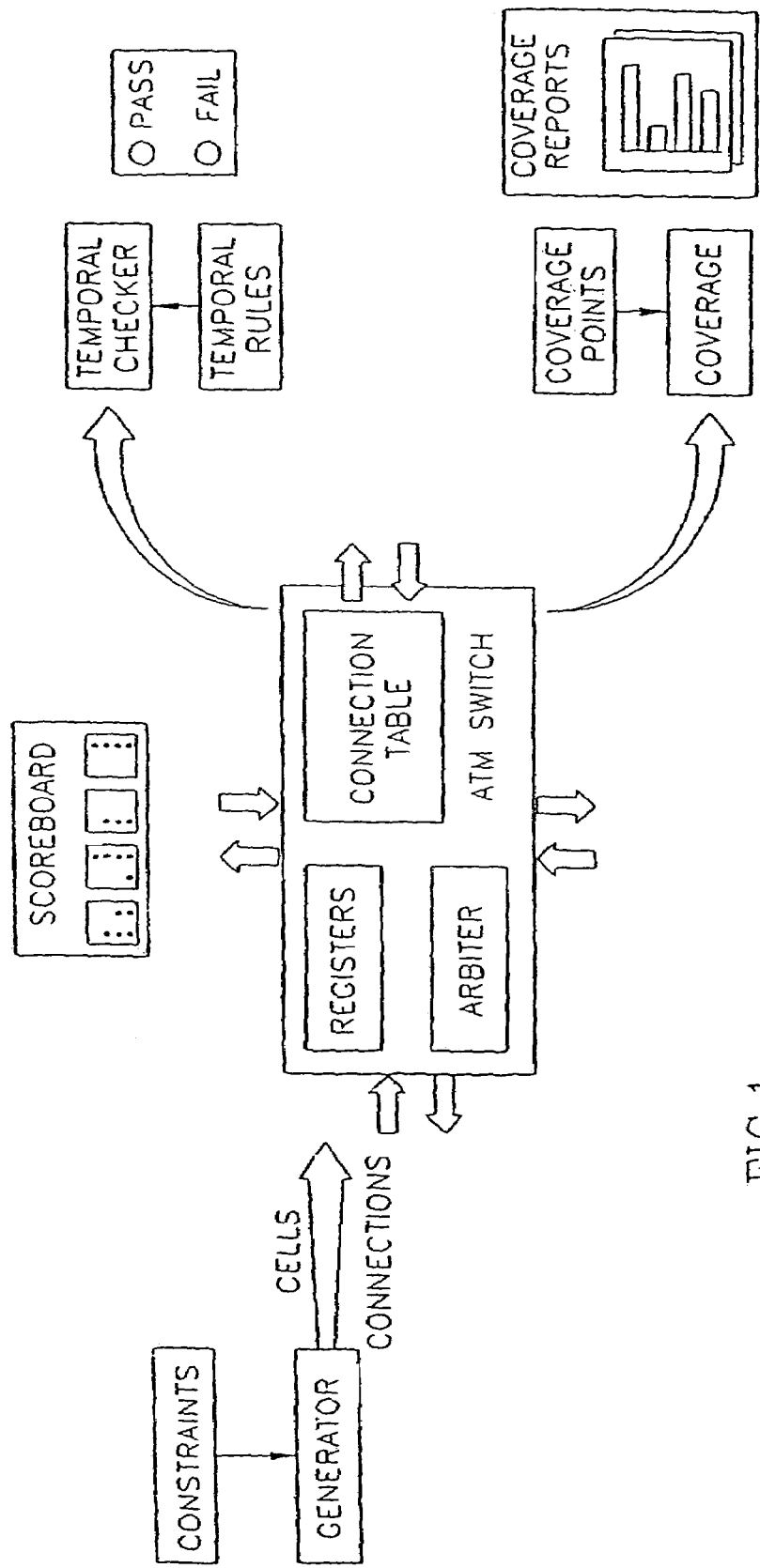
FIG. 1 illustrates a representative design for an ATM switch, and shows the interaction of a test generator, with constraints, providing input to and monitoring output from the design. Temporal checking is applied, as is functional coverage, and the results are scoreboarded to provide a coverage report.
Figure 2:
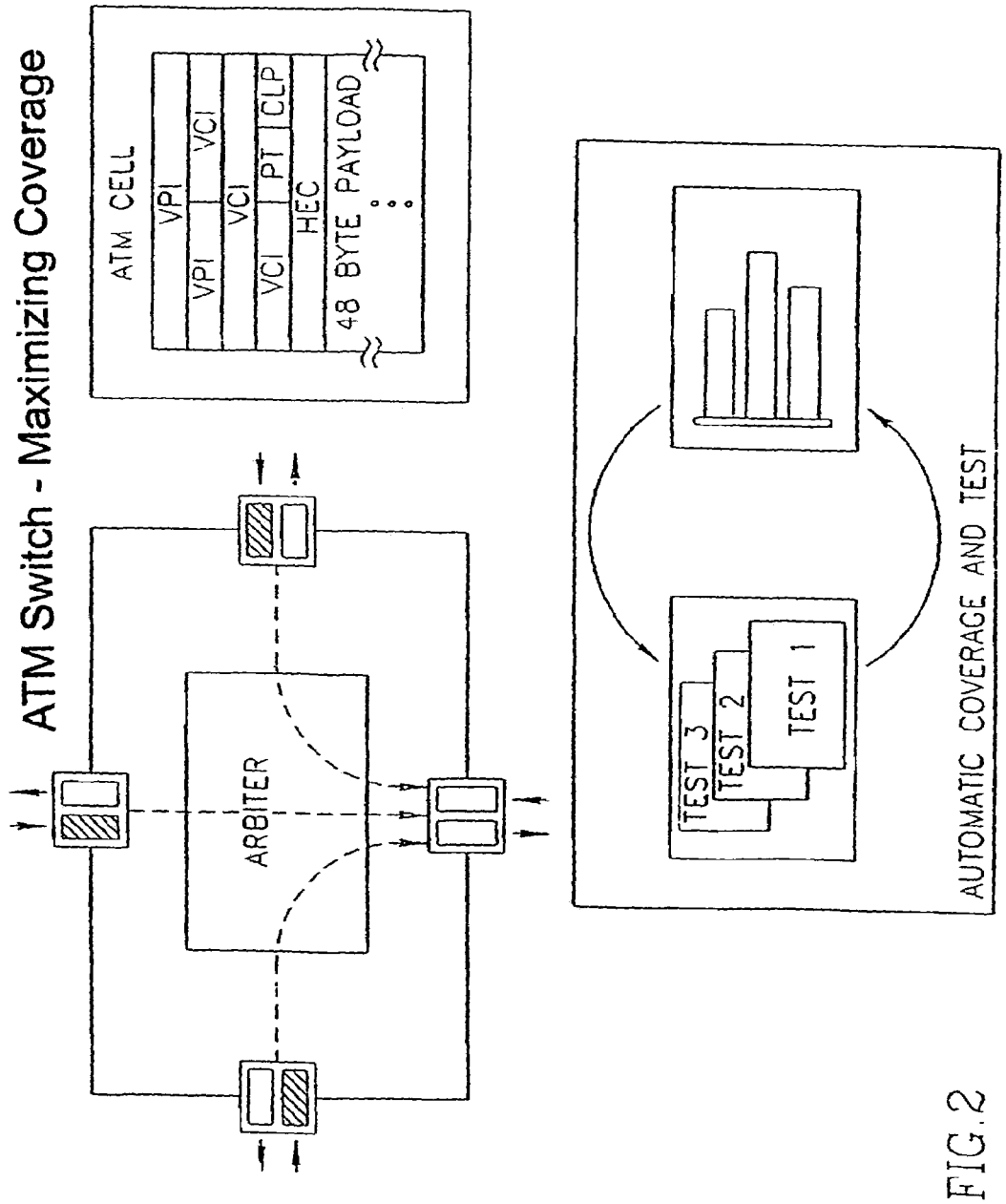
FIG. 2 illustrates a sequence of tests that can be applied, and a histogram showing the number of times tests 1, 2 or 3 were evaluated.

The present invention improves test coverage by identifying coverage holes, modifying the input process to test those areas, then repeating the process iteratively to continue to improve test coverage.

The method of the present invention preferably starts with a user-generated test, from which the coverage information is more preferably extracted, for example from the environment architectural files, and/or from other existing sources of coverage and testing information. Such information optionally and preferably includes coverage groups, items and buckets. Additionally, coverage information is preferably extracted from the DUT implementation. Next, the test is run and the results are analyzed. Coverage holes are then automatically detected and targeted by augmenting the test, optionally with additional constraints. The method of the present invention optionally and most preferably does not alter the user's original test, but instead adds constraints to a separate version of the test, such that the original constraints of the user are stored separately. Also, the method of the present invention has the advantage of being able to determine that certain sets of constraints will prevent certain values or ranges of values from ever being reached by the test, and can act accordingly (for example create a copy of the test where the obstructing constraint is removed, or notify the user about the unreachable coverage goals)

In particular, the present invention is useful for solving the problem of constructing a test with improved coverage, such that if a set of test descriptors (or test instances) that are known to be "good" in some sense (or that their degree of "goodness" is known) is provided, another set that is (or has a good probability of being) "better" is constructed and/or identified.

"Goodness" (of a test instance) is typically associated with some coverage measure, such that references to "goodness" and coverage could be interchanged. Therefore, obtaining better coverage is clearly a goal of the method of the present invention. "Goodness" may be considered a set property (of the given test set), or an individual property of each test.

There are optionally three ways to obtain that coverage: external or purely user-defined; automatic, or purely derived from test and DUT; and inferred, or obtained from user-defined coverage, from which more interesting coverage points and measures are calculated (derived). A number of possibilities for deriving inferred coverage from the DUT arise, such as application of state-machine analysis techniques for obtaining reachability information and primary-input-transition relations, as well as transition independence results (that might assist and direct test-case combinations, see below).

The method of the present invention optionally and preferably has two major components: (a) a coverage goal discovery mechanism, and (b) a test generation mechanism. A goal may generally be described as anything that might be explicitly or implicitly designated as a candidate for some maximization, or optimization process. Goals are optionally and preferably separated into two categories. The first category is directly-controllable goals, which are, basically, predicates on the injected stimuli to a DUT that might be imposed (and solved) by Specman, using a combination of temporal expressions and constraints. The second category includes all other types of goals, which might be further described as stimulus-only predicates that cannot be solved by the generator for complexity reasons (e.g., a packet with crc error), or predicates depending on DUT internal states and traces, or relating them to any other "goals" (through cross-coverage, for example).

Note that while all coverage points explicitly defined by the user in any test might be "goals", goals are not identical with "coverage points" for a number of reasons. First, new goals might emerge from analyzing a test definition. Second, new goals might emerge from analyzing a test-run. Third, new goals might emerge from analyzing the DUT.

The method of the present invention may optionally and preferably employ the following coverage goal discovery mechanisms. First, coverage goals may optionally be obtained by analyzing DUT structure, similar to prior art, for instance covering all states of a state machine embedded within the DUT. These goals may also optionally be explicitly defined by the user, for example as coverage points defined in e architecture files. These goals may also optionally be implicitly extracted based on the data types used, such as for example bounded data types, for which their boundary values become coverage goals. In addition, these goals may be implicitly defined in the definition of the test environment or specific test files, by identifying values of importance. For example, a particular value assignment used in one user test defines a partition in the range of the assigned field. That partition is used to define new goals (buckets) for the field.

Optionally and more preferably, these goals may be defined by crossing between the above goals, as the cross between two explicit coverage goals or the cross between an explicit coverage goal and a DUT structure based coverage goal, or the cross between an implicit goal and an explicit goal, or a cross between implicit goals. A cross is the Cartesian product of the coverage goals, such that if goal 1 can have N values—or buckets—and goal 2 has M values the cross product is a matrix of M×N values.

With regard to the test generation mechanism, the method of present invention preferably uses a unique constraint based test generator. Tests are more preferably generated by using a combination of the following methods: superimposing user provided constraints from different tests; superimposing user defined constraints and constrains computed to aim at a particular coverage goal; and combining any of the above with random policies that skew the generation probability.

Random policies control the probability of generation for scalars. In general the generator uses a normal distribution in which each number in a range has the same probability of being generated. An example of a different policy that is advantageous for testing is a policy which emphasizes range boundaries, such that the probability of a boundary is higher that a number in the middle of the range. Different random policies can be applied together, to different scalar fields of the generated test.

According to preferred embodiments of the present invention, tests are combined in order to increase cross coverage of measures obtained by these tests. With regard to the DUT, a test-instance is just a sequence of time/stimuli pairs, representing an injected stimuli at its corresponding (DUT) time of injection. However, according to the preferred implementation of the method of the present invention with the Specman™ software, which is more abstract, a test-instance is just a sequence of temporal expression/generation action pairs, representing data generated according to the constraints present when the temporal predicate becomes true (fires). Tests could optionally be combined with both of these representations. Such combinations might optionally include but are not limited to, simple union, which generates everything that would have been generated in either test; if-possible-and, in which everything is generated as in the first test, but if the same data is generated at the second test, the second test constraints are applied if possible; non-deterministic selection of temporal "guards", with non-deterministic selection of a test if a plurality of the tests should be generated at some moment. Also, these combinations could themselves optionally be combined. Such combinations are optionally and preferably controlled by adaptive algorithms that relate implicit features in each test to the goals of the combined test. Such adaptive algorithms include, but are not limited to, genetic algorithms neural networks, linear programming and various bounded search algorithms.

The effect of such combinations, and their probability of success, is very hard to predict theoretically, but is closely related to the state-machine properties of the DUT.

Figure 3A:
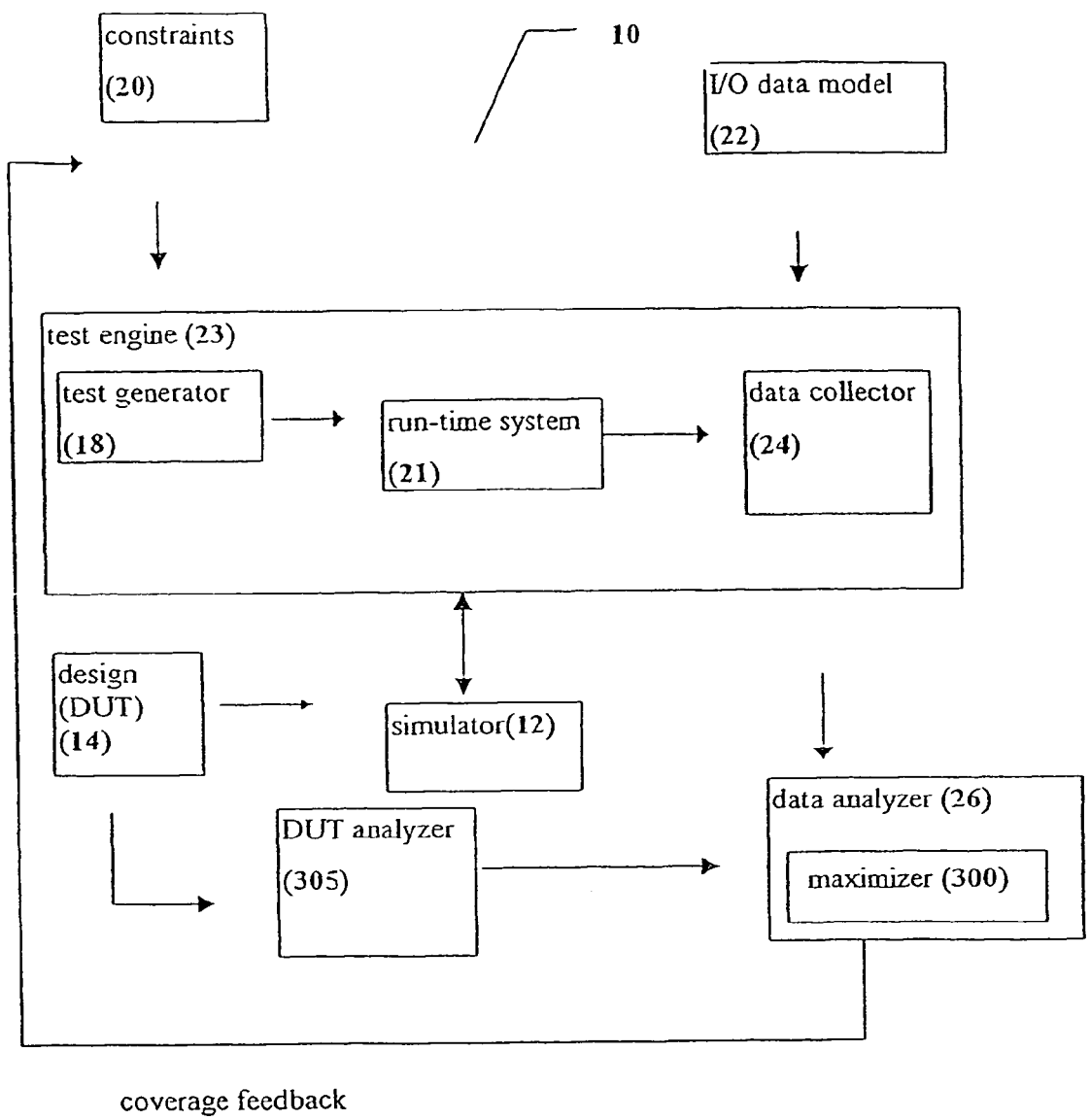
FIG. 3A illustrates the traditional Specman "e" test environment, and a DUT (physical or simulated or both) interacting through Specman Elite software to test the DUT for functional accuracy, with the addition of a coverage maximizer.

Referring now to the drawings, FIG. 3A is a schematic block diagram illustrating an exemplary system according to the present invention for test generation. It should be noted that the illustrated system only includes those general functions of the test generation procedure which are required for the description of the present invention. A more complete description of the entire test generation procedure may be found in U.S. patent application Ser. No. 09/020,792, previously incorporated by reference. It should also be noted that although the present invention is described in the context of a simulation model, the present invention is also useful for verification of a physical device. Both the physical device and the simulation model can be described as a DUT (device under test), which is in a test environment.

A test generation system 10 according to the present invention features a simulator 12, which may accept a design 14 for the device under test (DUT), written in a hardware descriptive language such as Verilog or VHDL. In addition, simulator 12 interacts with a test engine 16 for performing the test generation procedure at run-time. The interaction between simulator 12 and test engine 16 is shown as bi-directional, since test engine 16 provides input to simulator 12, and in turn receives the results from simulator 12 as input for further operation.

Test engine 16 features a test generator 18, connected to a run-time system 21 for testing DUT 14 at run-time. Test generator 18 receives a set of constraints 20 and an I/O data model 22, and then performs the testing and verification of DUT 14. According to the present invention, constraints 20 include at least one set of a plurality of dynamic constraints, which are then solved according to the method of the present invention, as described in greater detail below. Run-time system 21 both drives and samples simulator 12 during the run-time testing procedure.

During the process of testing and verification, a data collector 24 requests the values for one or more variables from run-time system 21. These requests are optionally performed according to a triggering event emitted by run-time system 21. For example, for collection of data related to temporal coverage, such a triggering event is optionally a fixed, predefined sampling time and/or the occurrence of a temporal pattern of state transitions as defined by a temporal expression given in a temporal language, for example. Data collector 24 is able to communicate with test generator 18 and to access the requested data through the API (application programming interface) for test generator 18. Such an API specifies the software function calls required in order to collect the desired data. This collected data is then analyzed by a data analyzer 26.

According to the present invention, data analyzer 26 features a maximizer 300, for maximizing test coverage. As described in greater detail with regard to FIG. 3B, maximizer 300 preferably receives information about DUT 14 from an optional analysis module 305 and various tests from test generator 18. This information is then used to create new tests and/or adjust one or more constraints at constraints 20.

According to a preferred embodiment of the present invention, constraints 20 and I/O data model 22 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. For dynamic constraints, as described in greater detail with regard to FIGS. 4 and 5 below, a selected, specific solution is provided according to the present invention for each instance of test generation. This solution is then used to provide limitations on the generated data values.

Figure 3B:
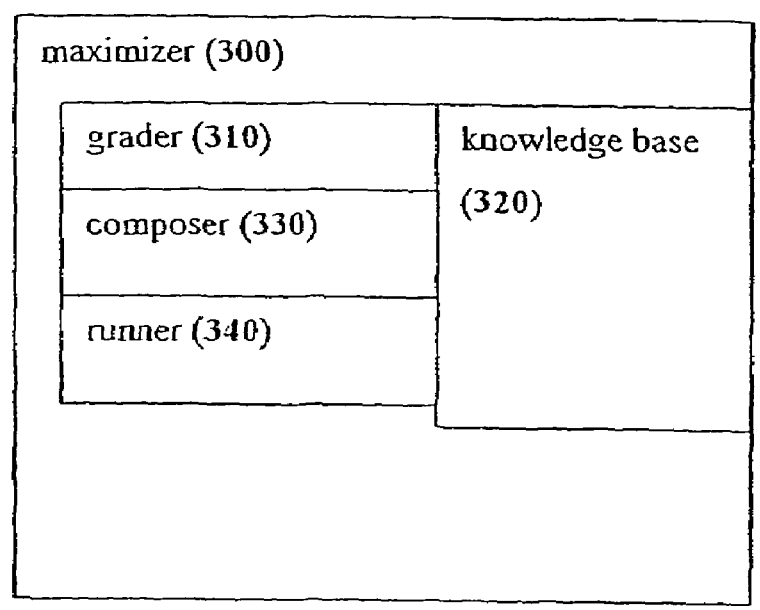
FIG. 3B illustrates an exemplary but preferred implementation of the maximizer of FIG. 3A in greater detail.

FIG. 3B shows an exemplary implementation of maximizer 300 in more detail. Maximizer 300 features a grader 310 for receiving the input test set (for input to test generator 18 of FIG. 3A), and optionally the designated goals. Grader 310 then preferably consults and updates a knowledge base 320 in order to perform such functions as feature detection, feature grading, and goal detection. Feature detection is preferably performed by extracting new features from an existing test set, which are not designated as input goals. For example, the mechanism for finding coverage holes in general stimuli is one example of such an operation. With regard to goal detection, these new goals are optionally detected from a given set of goals as follows. First, the goals may optionally be extracted by logical inference:

to achieve A or B one might want to achieve A or achieve B to achieve A and B one might want to achieve A and achieve B if it is known that A=>B that to achieve A. one might want to achieve A (with some probability)

if it is known that A=>~B, one might want to achieve ~A in order to achieve B

In addition, temporal logic inference may optionally be used to discover new goals as follows:

if A leads to eventually B, one might want to achieve B (when the goal is B if A and B (in any order) lead to C one might try to achieve A and B (in whatever order)

Of course, past experience could also be used, for example in order to obtain information from knowledge base 320, particularly with regard to statistical past experience relating goals to sub-goals. Such past experience may be represented explicitly as a statistical function, or implicitly as a mutation probability or a synaptic weight in a neural network.

Next, a composer 330 preferably receives the results from grader 310 and composes and/or mutates test definitions. Composer 330 may also optionally consult knowledge base 320 before composing and/or mutating the test definitions. These test definitions are then optionally and preferably fed to a runner 340, which grades the actual composed tests and updates knowledge base 320.

Features are preferably graded by using knowledge base 320 to measure the preferably weighted success for any given feature to determine a particular goal, given all detected features and emergent goals. An internal representation of this grading process is thus preferably fed to composer 330.

Knowledge base 320 itself preferably contains mappings from "feature building blocks" to goals. These feature building blocks are more preferably determined according to recipes. A recipe is preferably defined as an internal representation of a part of a test; it can be (the equivalent of) a single gen-action, a sequence of such, a generation and injection timed process (Time Consuming Method), or a full-blown test.

A recipe may optionally have a pre-condition specifying when it is applicable (for certain goals); it might be a simple Boolean as well as a complex temporary expression and trace predicates (for both generation- and DUT-trace). Recipes are also optionally and more preferably parameterized, as in "this is a recipe for self register N to zero" (N is a parameter) or "this is a recipe for causing integrate buffer J overflow" (J is the parameter).

Recipes preferably have a statistical measure relating them to the goal(so they supposedly achieved; e.g., "this recipe will probably (80%) lead to a collision (with a proper pre-condition, of course)".

Recipes may optionally be constructed recursively from other (sub) recipes using construction rules. Preferably, the same construction rules are applied to recipes "internally" and "externally", both for creating a new recipe and for combining recipes to form a new recipe.

FIGS. 3A and 3B illustrate an optional embodiment of maximizer 300 which has a basic set of functions, which can be described as "input-only" maximizer. In this implementation, all designated goals are features; i.e., all goals are described in the "input language", and thus are "solvable generated stimuli predicates". Also, feature detection and goal detection somewhat coincide (degenerate into each other).

Recipes are preferably role constraints and role generation-trace predicates. Roles are preferably used in order to simplify the situation in which a struct type might be generated in different contexts, with different constraints applicable to it and its descendants. A generation role is a conceptualization of this need for a "struct-type in context", or for being able to define the struct according to the context, such that the struct type is correctly generated according to both the definition of the struct and the context in which the struct is generated.

Optionally and more preferably, meta-random policies are used to augment the implementation of maximizer 300. The meta-random testing scheme enables the generation history of a field in a role to be affected using general heuristics and state definitions. For each role a random policy, which governs statistical distribution of the generation in that role, is assigned. The assignment of random policies may be done randomly or through analysis. When a random assignment policy is used, a count is assigned, indicating how many generations using this policy will be executed before a new policy will be picked. This scheme is optionally and preferably implemented in conjunction with a constraint based test generation system such as Specman™.

Given a seed-domain, a range-list RL, and possibly (part of) the seed-domain's generation history, a random policy determines the way a new value will be generated for that seed domain. The following policies may optionally be implemented for example:

min—the minimal item in RL has higher probability max—the maximal item in RL has higher probability median—an item from "the middle" of RL has higher probability alt_min_max—alternating min and max have higher probability, starting with min alt_max_min—alternating min and max have higher probability, starting with max min_or_max—min or max have higher probability, randomly edges—a value that is an edge in RL random—random diff_then_prev—a value different then previous value has higher probability, if possible eq_to_prev—a value equal to previous value has higher probability, if possible uniq—a value different from ALL previous values has higher probability, if possible The policies also optionally and preferably have a number of features related to the ability to consider generation history. For example, 0-look-back is when the policy does not imply looking at generation history. 1-look-back is when the policy implies looking at last generated value only. unbound-look-back is when the policy implies looking at the whole generation policy.

Deterministic examples of these policies are given as follows.

0-look-back:
min==>min(RL)
max==>max(RL)
median==>rl[ceiling(size(RL)/2)]
1-look-back:
alt_min_max==>prev was min ? max(RL): min(RL)
alt_max_min==>prev was min ? max(RL): min(RL)

Figure 4:
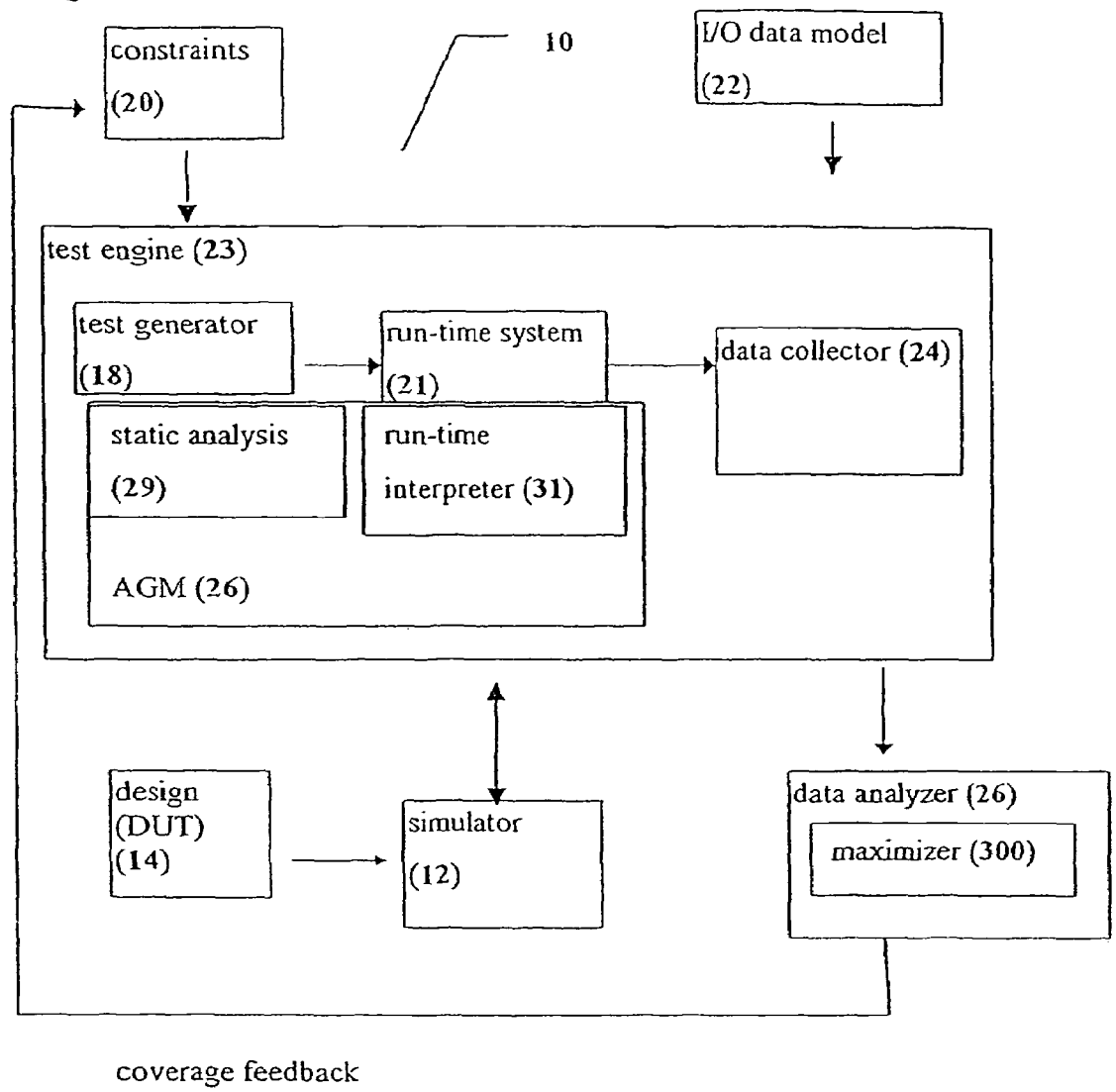
FIG. 4 illustrates the system of FIG. 3, with the optional but preferred addition of dynamic constraint evaluation through static analysis.

For non-deterministic policies, 0-look-back is defined as follows:
min_or_max==>rnd([min(RL), max(RL)]
edges==>rnd(edges(RL))
random==>rnd(RL)
1-look-back:
diff_then_prev==>rnd(RL[prev]) if possible
eq_to_prev==>[prev] if possible
unbound-look-back:
uniq==>rnd(RL-[all_prev]) is possible FIG. 4 shows system 10 from FIG. 3 with the addition of an AGM (abstract generation machine) module 26 for solving dynamic constraints. AGM module 26 creates a sequence of instructions in a "generator mini-language" (GML). These instructions are then executed in order to provide a correct random solution to any given set of dynamic constraints. Briefly, a static analysis module 29 preferably performs an initial analysis of the dynamic constraints before runtime, in cooperation with test generator 18. This initial analysis preferably produces a set of instructions for generating the correct, random solution. Next, a run-time interpreter module 31 preferably receives these instructions, and executes them in conjunction with run-time system 21. A more detailed description of AGM module 26 is provided with regard to FIG. 5 below.

Figure 5:
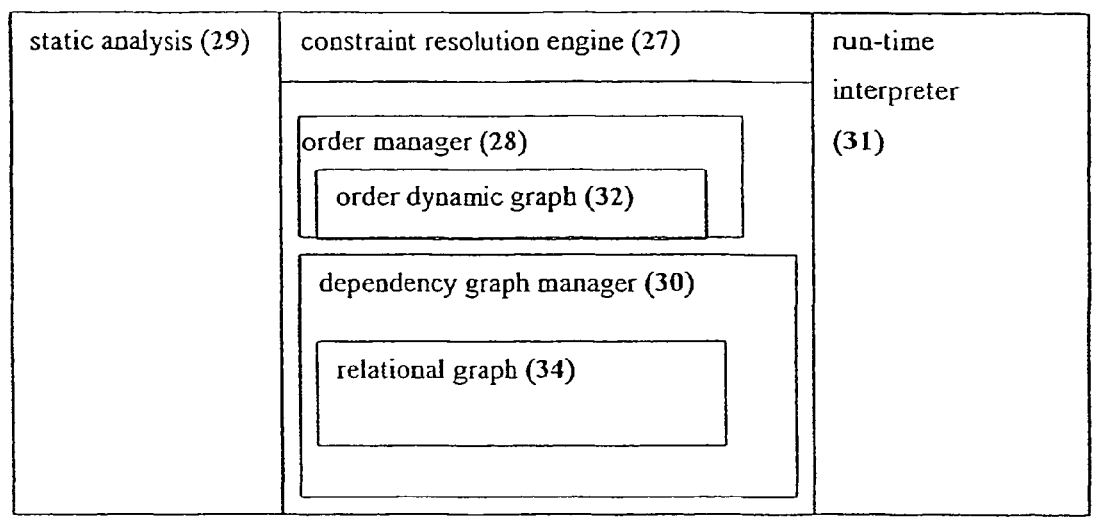
FIG. 5 illustrates an abstraction generation machine from FIG. 4 in more detail.

Turning now to FIG. 5, the schematic block diagram shows an exemplary but preferred implementation of AGM module 26 from FIG. 1. As shown, AGM module 26 preferably features a constraint resolution engine 27, in addition to static analysis module 29 and run-time interpreter 31. Constraint resolution engine 27 enables the process of resolving constraints to be at least partially performed before run-time, in the static analysis stage, thereby making the process of constraint resolution both more effective and more efficient. A set of instructions is then prepared for execution during run-time by constraint resolution engine 27. Thus, unlike the background art, which requires constraint resolution to occur during run-time, the present invention is capable of separating the process of constraint resolution into two stages: during static analysis (before run-time), after which a set of instructions is prepared; and during run-time, when these instructions are executed.

According to preferred embodiments of the present invention, constraint resolution engine 27 may optionally and preferably feature an order manager 28 and a dependency graph manager 30. Briefly, static analysis module 29 performs the initial analysis of the constraints for creating a set of instructions for execution in order to create the random solution, while run-time interpreter 31 executes these instructions.

Order manager 28 preferably maintains a dynamic graph 32 with bi-directional and unidirectional edges. Dynamic graph 32 is more preferably used to determine the order of incorporation of the instruction representing each constraint, according to the order which is implied between the nodes of dynamic graph 32. This order in turn is more preferably determined according to the set of provided constraints. Each node represents an instruction to be executed. Each instruction is in turn created according to the relationships between constraints, as determined by dependency graph manager 30.

Dependency graph manager 30 in turn optionally and preferably maintains a dynamic bi-partite relational graph 34 relating nodes and constraints. Each node represents field ranges for specific variables, for which particular values can be generated as part of the test generation process. Dependency graph manager 30 uses relational graph 34 in a process by which the consistency of ranges of legal values of the set of provided constraints is maintained, which is part of the reducing mechanism. Optionally and more preferably, dependency graph manager 30 is able to reduce the number of relationships which must be examined to maintain consistency.

Order manager 28 and dependency graph manager 30 together preferably create a static series of instructions according to commands from static analysis module 29, which, when executed by run-time interpreter 31, provide a solution to the set of constraints. This solution is more preferably provided as a set of values for variables. As previously described, if the e language is used to describe the constraints and the data model for test generation, then these values may optionally include data elements such as scalars, structs and fields.

As illustrated in FIGS. 4 and 5, system 10 has some additional advantages over the implementation of the system in FIGS. 3A and 3B. In particular, maximizer 300 and AGM 26 may optionally be described as cooperating according to the following process, in which the automatic coverage extraction performed by maximizer 300 uses the internal data representation and algorithm from AGM 26 to perform the following process.

First, generation roles are translated into coverage groups. Next, new e code for emitting an event corresponding to the generation of a struct in each role is produced. Then, each generatable field is translated into a coverage item. The initial range of values for a generatable field, inferred by static analysis, is defined to be the legal values for the corresponding coverage item.

Next, buckets are defined (and refined) for such items, using, in addition to other algorithms, the set of applicable constraints on that field in the role as inferred by Static Analysis. Thus, the extraction phase of maximizer 300 optionally and more preferably uses the following information, derived from static analysis: generation roles; generatable fields in role; initial ranges of generatable fields in role; and applicable constraints on generatable fields in role.

What is claimed is:

1. A method for determining functional coverage of a design for a device under test (DUT), according to a coverage metric, in a test environment during a design test verification process, the coverage metric being constructed from a plurality of coverage items, the method comprising:
   obtaining a coverage group from said design, for examining during the design test verification process, said coverage group including at least one functional coverage item;
   providing a set of input test values to the test verification process;
   performing the design test verification process with said set of input test values to obtain a value for each coverage item;
   examining obtained coverage with said coverage group according to said value obtained from each coverage item, by comparing said value with a coverage goal; and
   automatically altering said set of input test values according to said comparison for adaptively improving test coverage.

2. The method of claim 1, wherein said coverage group is obtained from a description provided manually.

3. The method of claim 1, wherein said coverage group is obtained from the DUT circuit design specification.

4. The method of claim 1, wherein said coverage group is obtained from a test defined by the test environment.

5. The method of claim 1, wherein each coverage item is a value holding element of at least one of the DUT circuit design and the test environment and an expression defining a sampling condition for sampling said value, such tat the test verification process is performed by sampling said value when said sampling condition is met to form sampled values, and wherein coverage is measured according to said sampled values.

6. A system for determining functional coverage of a design for a device under test (DUT), in a test environment during a design test verification process, utilizing a coverage metric being constructed from a plurality of coverage items, obtained from said design, each coverage item having a variable, a value of the variable being determined for each test of the design test verification process, the system comprising:
   (a) a test generator for receiving at least one constraint for constraining the value of at least one variable and for generating the test according to the DUT circuit design specification;
   (b) a run-time system for running the test and for collecting data at run time; and
   (c) a maximizer for receiving the test from said test generator and for receiving said data collected at run time, said maximizer generating an additional test for adaptively improving test coverage according to the test, said said metric, and data collected at run time.

7. The system of claim 6, further comprising:
   (d) an analysis module for receiving information about the DUT circuit design specifications and for analyzing said information, such that said analyzed information is passed to said maximizer for generating said additional test.

8. The system of claim 7, wherein said analysis module is configured to receive information about the test environment and to analyze said information for passing said information to said maximizer for generating said additional test.

9. The system of claim 8, wherein said information about the test environment includes manually determined information from a previous test.

10. A method for determining functional coverage of a design for a device under test (DUT), according to a coverage metric, in a test environment during a design test verification process, the functional coverage being determined according to a coverage metric, the coverage metric being constructed from a plurality of coverage items, obtained from said design, each coverage item having a variable for being sampled, the method comprising:
    providing a set of input test values to the design test verification process to form a generated test;
    performing the design test verification process with said set of input test values of said generated test to obtain a value for the variable of each coverage item according to the sampling condition;
    examining obtained coverage, by comparing said value obtained from each coverage item with a coverage goal; and
    automatically altering said set of input test values according to said examining, to form a new generated test for adaptively improving test coverage.

11. The method of claim 10, wherein at least one coverage item is a flinctional coverage item, and the variable of said functional coverage item is sampled according to a sampling condition for sampling said value for the variable.

12. The method of claim 11, wherein said new generated test is formed according to at least one coverage goal, said at least one coverage goal being automatically determined according to an analysis of at least one of the DUT circuit design and the test environment.

13. The method of claim 12, wherein said analysis is perfonned on the DUT circuit design specifications to extract said at least one coverage goal from a structure of the DUT.

14. The method of claim 12, wherein said at least one coverage goal is manually defined from the test environment.

15. The method of claim 14, wherein a plurality of coverage goals is manually defined from the test environment, and an additional coverage goal is automatically determined from a combination of at least two of said manually defined coverage goals.

16. The method of claim 12, wherein said at least one coverage goal is defined according to an automatic analysis of a type of each variable for at least one coverage item.

17. The method of claim 16, wherein said automatic analysis determines at least one boundary for a possible value of each variable for at least one coverage item, and wherein said at least one coverage goal is determined according to said at least one boundary.

18. The method of claim 16, wherein said automatic analysis is performed by:
    analyzing the test environment to determine a value of at least one variable; and
    defining said at least one coverage goal according to said value.

19. The method of claim 18, wherein said value defines a boundary for possible values for said at least one variable.

20. The method of claim 19, wherein said possible values are included in a range of values for said at least one variable and said boundary partitions said range.

21. The method of claim 16, wherein a plurality of coverage goals is defined according to said automatic analysis, and an additional coverage goal is automatically determined from a combination of at least two of said automatically defined coverage goals.

22. The method of claim 16, wherein at least one coverage goal is manually defined from the test environment, and an additional coverage goal is automatically determined from a combination of an automatically defined coverage goal and said manually defined coverage goal.

23. The method of claim 22, wherein said combination is determined from a Cartesian product of said automatically defined coverage goal and said manually defined coverage goal, such if said automatically defined coverage goal has N possible values said manually defined coverage goal has M possible values, said combination is a matrix of M×N values.

24. The method of claim 12, wherein said new generated test includes at least one constraint for constraining a value for at least one variable.

25. The method of claim 24, wherein said at least one constraint is retrieved from a manually determined constraint from a previously generated test.

26. The method of claim 24, wherein at least one additional constraint is created according to said at least one coverage goal.

27. The method of claim 24, wherein at least one constraint is created according to a combination of a manually determined constraint from a previously generated test and a particular coverage goal.

28. The method of claim 24, wherein an effect of said at least one constraint on generation of said new generated test is at least partially determined according to a random policy for affecting the generation probability.

* * * * *